United States Patent [19]
Park

[11] Patent Number: 5,457,063
[45] Date of Patent: Oct. 10, 1995

[54] METHOD FOR FABRICATING A CAPACITOR FOR A DYNAMIC RANDOM ACCESS MEMORY CELL

[75] Inventor: Young J. Park, Bubal-eub, Rep. of Korea

[73] Assignee: Hyundai Electronics Industries Co., Ltd., Rep. of Korea

[21] Appl. No.: 230,343

[22] Filed: Apr. 20, 1994

[30] Foreign Application Priority Data

Apr. 20, 1993 [KR] Rep. of Korea .................. 93-06621

[51] Int. Cl.$^6$ .......................... H01L 21/70; H01L 27/00
[52] U.S. Cl. ............................. 437/52; 437/60; 437/919
[58] Field of Search .................. 437/52, 919, 60, 437/47

[56] References Cited

U.S. PATENT DOCUMENTS 5,084,405 1/1992 Fazan et al. .......................... 437/52
5,158,905 10/1992 Ahn ....................................... 437/52

Primary Examiner—Olik Chaudhuri
Assistant Examiner—H. Jey Tsai
Attorney, Agent, or Firm—Merchant, Gould, Smith, Edell, Welter & Schmidt

[57] ABSTRACT

A method for fabricating a capacitor of a dynamic random access memory cell having increased surface area and capacitance of its storage electrode which includes a plurality of vertical protrusions is disclosed. The capacitor includes an electrode plate electrically connected to a field effect transistor formed on a semiconductor substrate through interlayer insulating layers, a plurality of protrusions formed on the electrode plate, side walls respectively formed at side edges of the electrode plate, and a dielectric film and a plate electrode sequentially formed over the entire exposed surfaces of the electrode plate, the protrusions and the side walls.

9 Claims, 6 Drawing Sheets

METHOD FOR FABRICATING A CAPACITOR FOR A DYNAMIC RANDOM ACCESS MEMORY CELL

BACKGROUND OF THE INVENTION

1. Field of the Invention

The present invention relates to capacitor fabrication techniques applicable to dynamic random access memories (DRAMs) of highly integrated semiconductor devices, and more particularly, to capacitors of such DRAMs capable of achieving an improved degree of integration and a method for fabricating same.

2. Description of the Prior Art

Generally, a DRAM comprises a plurality of unit cells each including a capacitor for storing electric charges therein and a field effect transistor for opening and closing charging and discharging passages of the capacitor. As such, a DRAM generally has a higher degree of integration, and its DRAM cell generally has a reduced occupied area. Due to such reduction in an occupied area of a DRAM cell, it is difficult to ensure required storage capacitance. In order to inhibit such a decrease in storage capacitance caused by the reduced occupied area of the capacitor, there has been proposed a variety of methods for forming a plurality of vertical protrusions on the surface of storage electrodes, in an attempt to increase the surface area thereof. In accordance with such known methods, however, the number of vertical protrusions is considerably limited due to the reduced occupied area of memory cells. As a result, a conventional capacitor fabricated in accordance with such a method generally has insufficient storage capacitance because the storage electrode surface typically has a limited number of vertical protrusions.

FIGS. 1A to 1E are sectional views respectively illustrating a method for fabricating a conventional capacitor structure in which vertical protrusions are provided at its storage electrode.

In FIG. 1A, a silicon substrate 1 is shown, over which is formed an oxide film 2 for an element isolation, a gate oxide film 3, word lines 4 and insulating film spacers 5 in accordance with this method. Over the entire exposed surface of the silicon substrate 1, a first insulating layer 6 for planarization and a second insulating layer 7 are formed in this order. The second insulating layer 7 has a higher etch selectivity than that of the first insulating layer 6. Over the second insulating layer 7, a first polysilicon layer 8 for storage electrode and a third insulating layer 9 are sequentially formed. The first polysilicon layer 8 is connected to the surface of the silicon substrate 1 via the first and second insulating layers 6 and 7. The formation of the first polysilicon layer 8 is achieved by etching respective predetermined portions of the second insulating layer 7 and first insulating layer 6 to form a contact hole, and then thickly depositing polysilicon over the entire exposed surface of the resulting structure including the contact hole.

Thereafter, polysilicon pieces 10 are formed on the third insulating layer 9. The formation of polysilicon pieces 10 is achieved by maintaining the structure obtained after the formation of the third insulating layer 9 for a predetermined time under predetermined pressure, temperature and atmospheric conditions. For example, the conditions may be a pressure of 100 mtorr, a temperature of 580° C., and an atmosphere of $SiH_4$.

Using the polysilicon pieces 10 as a mask, the third insulating layer 9 is subsequently dry-etched at portions exposed between the polysilicon pieces 10, thereby forming a third insulating layer pattern 9A, as shown in FIG. 1B. Under a condition that the third insulating layer pattern 9A is used as a mask, the first polysilicon layer 8 is etched to a predetermined thickness at exposed portions, thereby forming a plurality of polysilicon protrusions 8A. Upon etching the first polysilicon layer 8, the polysilicon pieces 10 disposed on the third insulating layer pattern 9A are removed.

Over the entire exposed surface of the resulting structure, which is perspectively shown in FIG. 2, a fourth insulating layer 11 and a photoresist film pattern 12 are sequentially formed, as shown in FIG. 1C.

As shown in FIG. 1D, steps of forming a first polysilicon layer pattern 8B and a fourth insulating layer pattern 11A are carried out. The formation of these patterns 8B and 11A are achieved by etching the exposed portion of the fourth insulating layer 11 and respective portions of the third insulating layer pattern 9A, and the first polysilicon layer 8 disposed beneath the exposed portion of the fourth insulating layer 11 under a condition that the photoresist film pattern 12 is used as a mask. After the formation of the first polysilicon layer pattern 8B, the photoresist film pattern 12 is removed.

After completion of the steps discussed with regard to FIG. 1D, the fourth insulating layer pattern 11A, the third insulating layer pattern 9A and the second insulating layer 7 are wet-etched to be completely removed, as shown in FIG. 1E. As a result, a storage electrode, which is constituted by the first polysilicon pattern 8B and the polysilicon protrusions 8A, is exposed. Over the entire exposed surface of the storage electrode, a dielectric film 13 and a plate electrode 14 are sequentially formed, as shown in FIG. 1E. Thus, a capacitor is obtained.

FIG. 2 is a perspective view illustrating the storage electrode formed in accordance with the above-mentioned conventional method. By referring to FIG. 2, it can be found that the storage electrode includes an electrode plate constituted by the first polysilicon pattern 8B, and a plurality of vertical columns constituted by the protrusions 8A finely formed on the electrode plate.

The capacitor fabricated in accordance with the above-mentioned conventional method has an increased capacitance by virtue of its storage electrode having a structure including a plurality of finely formed vertical columns. However, since the number of vertical columns is greatly reduced due to the reduction in cell sizes, a significant amount of unexploited empty space is present along at the edge of the storage electrode. As a result, the capacitance of the capacitor is significantly limited.

SUMMARY OF THE INVENTION

Therefore, an object of the present invention is to provide a capacitor for a DRAM cell having an increased storage electrode surface area, and including a plurality of vertical columns, thereby improving the storage capacitance, and a method for fabricating the same.

In accordance with one aspect, the present invention provides a dynamic random access memory device including a plurality of unit cells each having a field effect transistor, a capacitor and interlayer insulating layers, all of the elements being formed on a semiconductor substrate, with the capacitor comprising: an electrode plate electrically connected to the field effect transistor formed on the semiconductor substrate through the interlayer insulating layers;

a plurality of protrusions formed on the electrode plate; side walls respectively formed at side edges of the electrode plate; and a dielectric film and a plate electrode sequentially formed over the entire exposed surfaces of the electrode plate, the protrusions and the side walls.

In accordance with another aspect, the present invention provides a method for fabricating a capacitor of a dynamic random access memory device, comprising the steps of: providing a semiconductor substrate including a field effect transistor, a first insulating layer and a second insulating layer, the insulating layers serving as interlayer insulating layers; forming an electrode plate electrically connected to the field effect transistor formed on the semiconductor substrate through the first and second insulating layers; forming a plurality of protrusions on the electrode plate; forming electrode side walls at side walls of the electrode plate, respectively; removing the second insulating layer such that a lower surface of the electrode plate is exposed; and sequentially forming a dielectric film and a plate electrode over the entire exposed surfaces of the electrode plate, the protrusions and the electrode side walls.

BRIEF DESCRIPTION OF THE DRAWINGS

These and other objects, features and advantages of the invention will become more apparent upon reading of the following detailed specification and drawings, in which.

DETAILED DESCRIPTION OF THE PREFERRED EMBODIMENTS

Figure 1A:
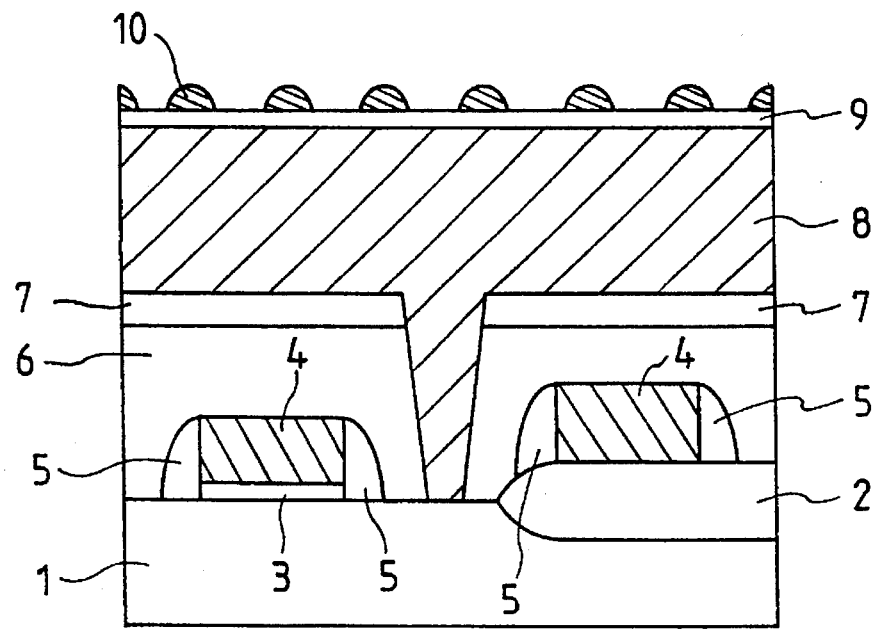
FIGS. 1A to 1E are sectional views respectively illustrating a method for fabricating a conventional DRAM cell capacitor.
Figure 1B:
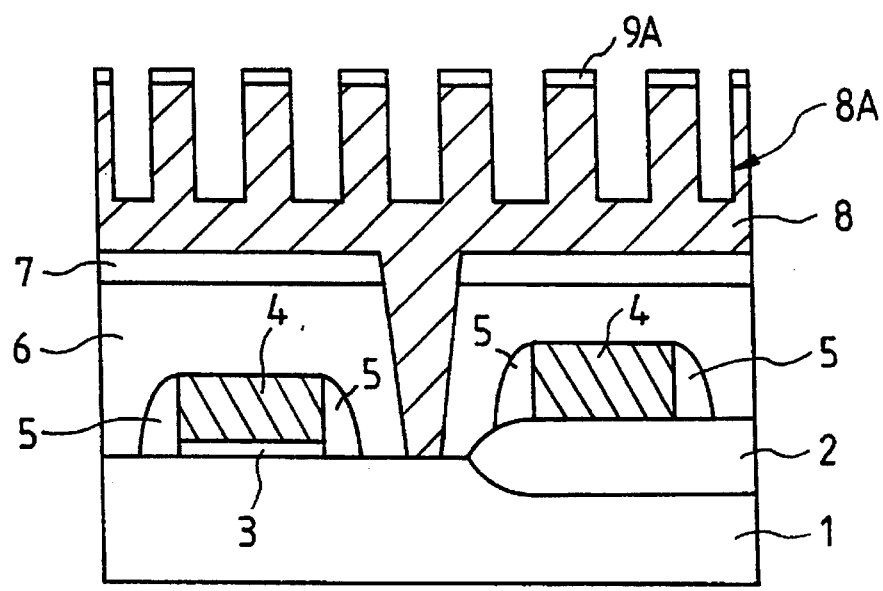
Figure 1C:
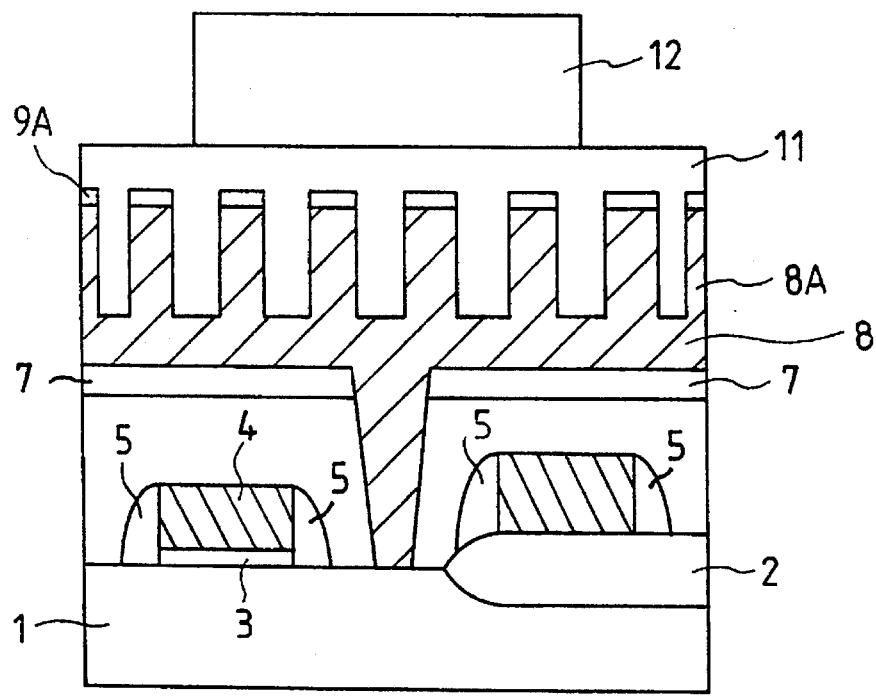
Figure 1D:
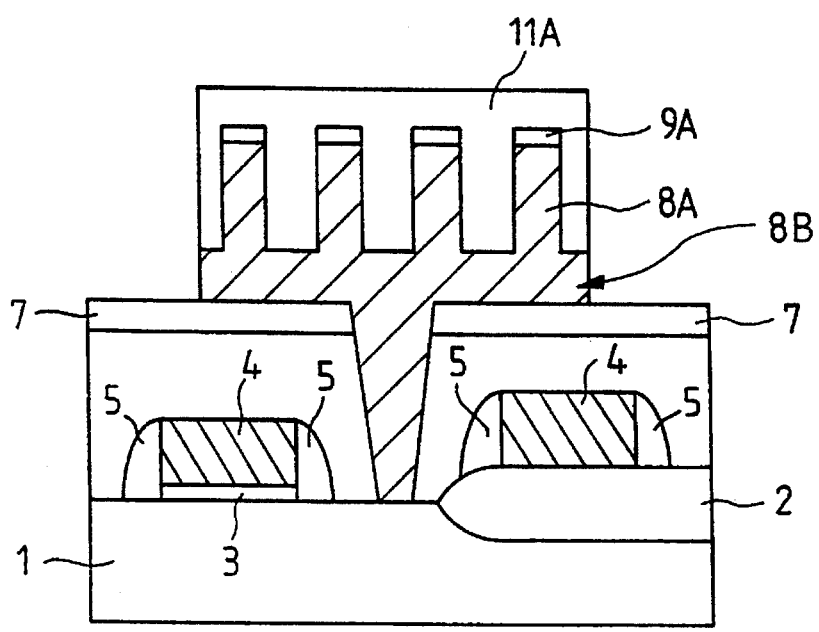
Figure 1E:
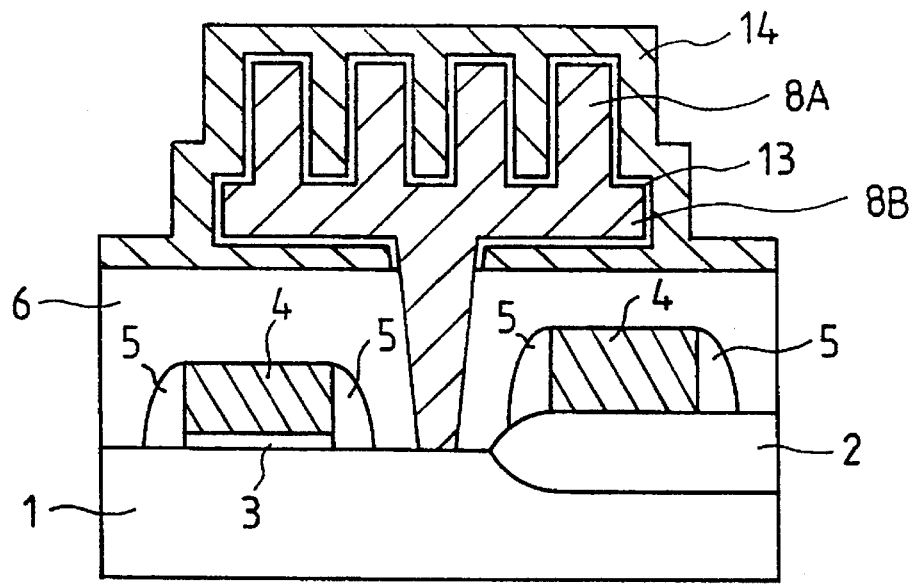
Figure 2:
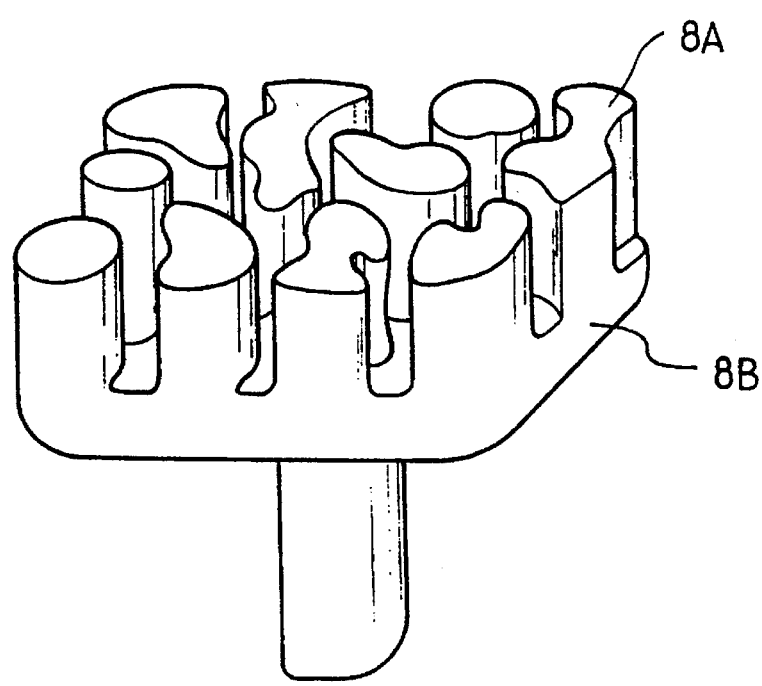
FIG. 2 is a perspective view of a storage electrode of a capacitor fabricated in accordance with a conventional method.
Figure 3A:
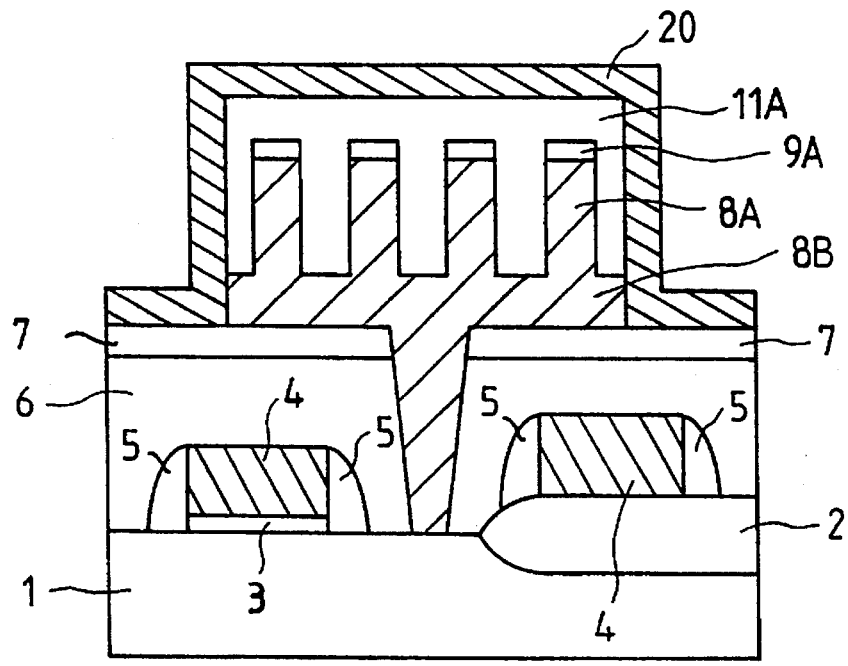
FIGS. 3A to 3D are sectional views respectively illustrating a method for fabricating a capacitor of a DRAM cell in accordance with the present invention.

FIGS. 3A to 3D are sectional views respectively illustrating a method for fabricating a capacitor of a DRAM cell in accordance with the present invention. FIG. 3A shows a structure including a field effect transistor and a plurality of vertical structures formed on a semiconductor substrate. This structure may be formed in the same manner as that of the conventional method illustrated in FIGS. 1A to 1D. In FIGS. 3A to 3D, elements corresponding to those in FIGS. 1A to 1D are denoted with the same reference numerals.

As shown in FIG. 3A, the structure includes a silicon substrate 1 which has element regions isolated from each other by an oxide film 2. At each element region, the silicon substrate 1 is formed with a gate oxide film 3, a word line 4 and insulating film spacers 5. The structure also includes a first insulating film 6, a second insulating film 7 and a first polysilicon pattern 8B. The first and second insulating films 6 and 7 serve as interlayer insulating films. The first polysilicon pattern 8B is electrically connected to a diffused drain region (not shown) and a diffused source region (not shown) through the second insulating film 7 and the first insulating film 6. A plurality of silicon protrusions 8A are provided on the first polysilicon pattern 8B. Also, the structure includes a third insulating layer pattern 9A formed over the polysilicon protrusions 8A, and a fourth insulating layer pattern 11A formed over the entire exposed surfaces of the first polysilicon pattern 8B and the third insulating layer pattern 9A.

In accordance with the method of the present invention, a second polysilicon layer 20 is uniformly deposited to a predetermined thickness over the entire exposed surfaces of the second insulating layer 7 and the fourth insulating layer pattern 11A, as shown in FIG. 3A.

Figure 3B:
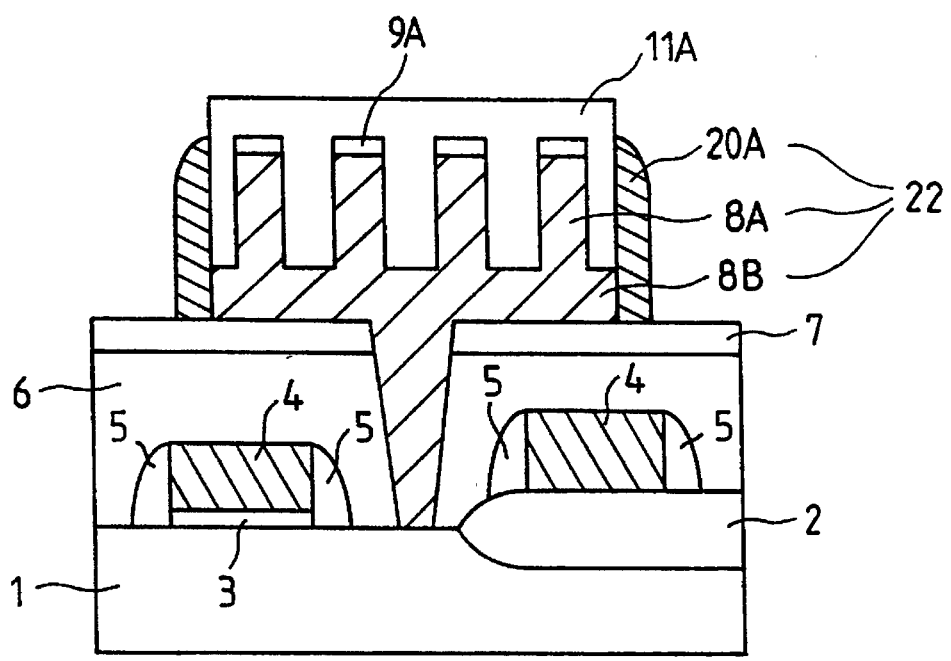

Thereafter, the second polysilicon layer 20 is anisotropically etched, thereby forming polysilicon side walls 20A, as shown in FIG. 3B. The polysilicon side walls 20A are in contact with all side surfaces of the polysilicon pattern 8B and the fourth insulating layer pattern 11A. The polysilicon side walls 20A also communicate electrically with the first polysilicon pattern 8B.

Figure 3C:
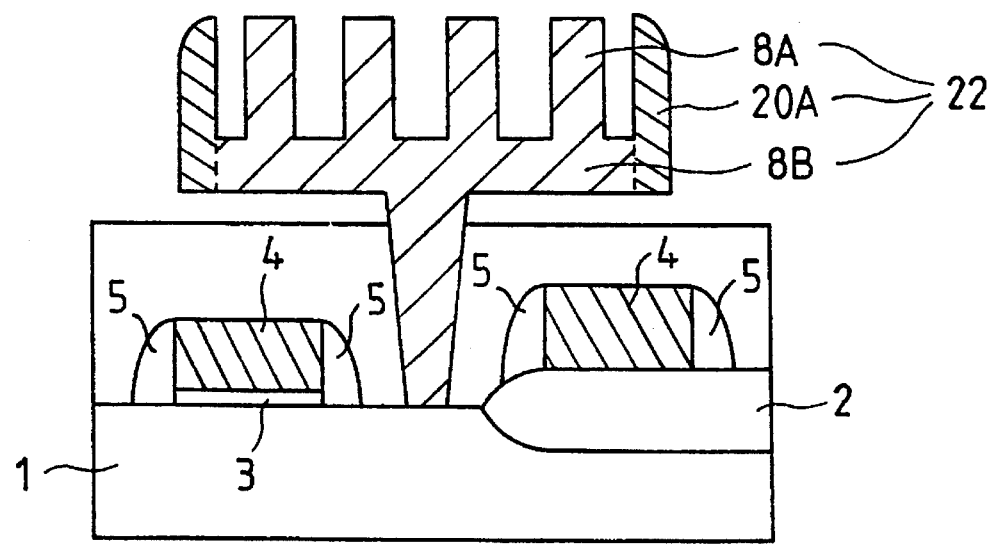

Subsequently, the fourth insulating layer pattern 11A exposed upon the anisotropic etching and the third insulating layer pattern 11A disposed beneath the fourth insulating layer pattern 9A are completely removed using a wet etch process such that the entire surface, namely, the lower and upper surfaces of the storage electrode 22 comprising by the polysilicon pattern 8B, the polysilicon protrusions 8A and the polysilicon side walls 20A, are exposed, as shown in FIG. 3C.

Figure 3D:
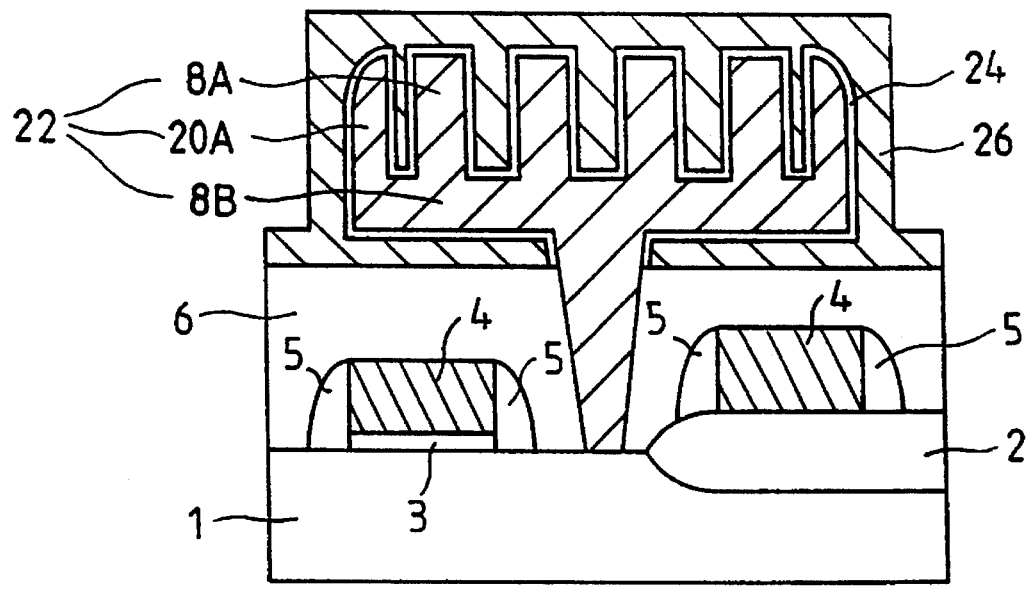

Over the entire exposed surface of the storage electrode 22, a dielectric film 24 and a plate electrode 26 are sequentially coated, as shown in FIG. 3D. Thus, a capacitor of a DRAM cell is fabricated.

Figure 4:
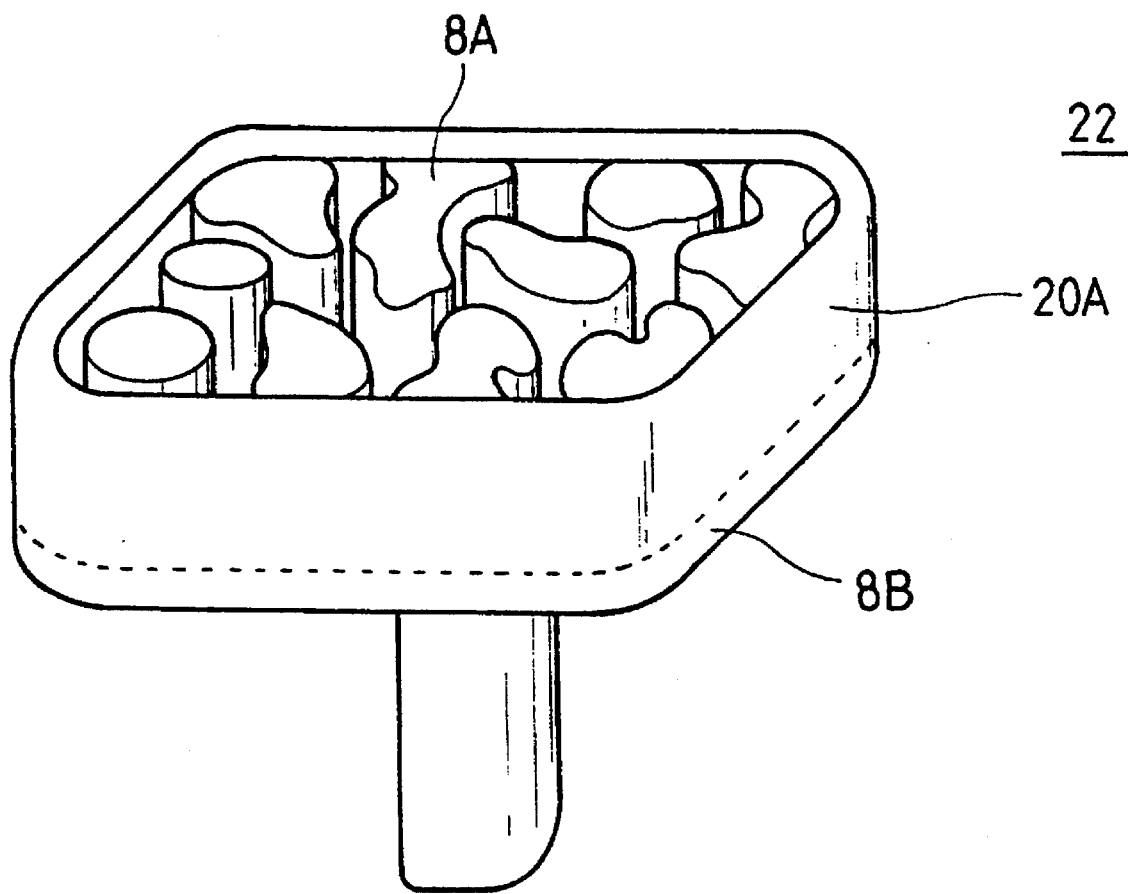
FIG. 4 is a perspective view of a storage electrode of a capacitor fabricated in accordance with the method of the present invention.

FIG. 4 is a perspective view illustrating the storage electrode 22 formed in accordance with the method of the present invention. The storage electrode 22 includes a planar polysilicon pattern 8B, the polysilicon protrusions 8A formed on the polysilicon pattern 8B, and the polysilicon side walls 20A respectively formed at the side edges of the polysilicon pattern 8B.

As apparent from the above description, the DRAM cell capacitor of the present invention has an increased surface area of the storage electrode 22 thereby providing a significant increase in storage capacitance by virtue of the side walls 20A formed at the side edges of the storage electrode 22. As a result, an appreciable reduction of the occupied area of the DRAM cell is provided, thus improving the degree of integration of a DRAM device.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for fabricating a capacitor of a dynamic random access memory device, comprising the steps of:

providing a semiconductor substrate including a field effect transistor, a first insulating layer and a second insulating layer, said first and second insulating layers serving as interlayer insulating layers;

forming an electrode plate of a first electrode material electrically connected to said field effect transistor formed on said semiconductor substrate through the first and second insulating layers;

forming a plurality of protrusions of said first electrode material on said electrode plate;

forming a fourth insulating layer pattern over said plurality of protrusions on said electrode plate;

forming electrode side walls at side walls of the electrode plate and the fourth insulating layer pattern;

removing the fourth insulating layer pattern;

removing the second insulating layer such that a lower surface of the electrode plate is exposed; and sequentially forming a dielectric film and a plate electrode over the entire exposed surfaces of said electrode plate, said protrusions, and said electrode side walls.

2. A method for fabricating a capacitor of a dynamic random access memory device, comprising the steps of:

providing a semiconductor substrate including a field effect transistor, a first insulating layer and a second insulating layer, said first and second insulating layers serving as interlayer insulating layers;

forming a first electrode material layer over the second insulating layer such that said first electrode material layer is electrically connected to said field effect transistor formed on said semiconductor substrate through the second insulating layer and the first insulating layer;

partially removing the first electrode material layer to form a plurality of protrusions made of the first electrode material at the first electrode material layer, then depositing a fourth insulating layer over the entire exposed surface of the resulting structure and then forming an electrode pattern mask on said fourth insulating layer;

removing portions of the fourth insulating layer exposed through said electrode pattern mask and respective portions of the protrusions and the first electrode material layer disposed beneath said exposed fourth insulating layer portions using said electrode pattern mask to form a fourth insulating layer pattern and a first electrode material pattern, then removing the electrode pattern mask and uniformly coating a second electrode material layer over the entire exposed surface of the resulting structure;

anisotropically etching said second electrode material layer to form side walls made of the second electrode material at side edges of the first electrode material pattern;

removing said fourth insulating layer pattern and said second insulating layer, thereby exposing a lower surface of the first electrode material pattern, the protrusions made of the first electrode material, and the side walls made of the second electrode material; and sequentially forming a dielectric film and a plate electrode over the entire exposed surfaces of the first electrode material pattern, the protrusions, and the side walls.

3. A method in accordance with claim 2, wherein said step of removing said fourth insulating layer pattern and said second insulating layer is carried out by concurrently wet-etching the fourth insulating layer pattern and the second insulating layer.

4. A method in accordance with claim 2, wherein said step of forming said protrusions comprises the steps of:

depositing a third insulating layer over said first electrode material layer and then forming a plurality of electrode material pieces on said third insulating layer;

patterning the third insulating layer using said electrode material pieces as a mask such that the first electrode material layer is partially exposed; and removing said exposed portions of the first electrode material layer to form a plurality of protrusions made of the first electrode material at the first electrode material layer.

5. A method in accordance with claim 4, wherein said first electrode material layer, said second electrode layer, and said electrode material pieces comprise polysilicon.

6. A method in accordance with claim 5, wherein said step of forming said electrode material pieces includes the step of maintaining the structure obtained after the formation of said third insulating layer for a duration of time under a predetermined pressure, temperature, and $SiH_4$ gas condition.

7. A method in accordance with claim 4, wherein said third insulating layer is removed using a wet etch process, together with said second insulating layer and said fourth insulating layer pattern.

8. A method for fabricating a capacitor of a dynamic random access memory device, comprising the steps of:

providing a semiconductor substrate including a field effect transistor, a first insulating layer and a second insulating layer, said first and second insulating layers serving as interlayer insulating layers;

forming an electrode plate of a first electrode material electrically connected to said field effect transistor formed on said semiconductor substrate through the first and second insulating layers;

forming a plurality of protrusions of said first electrode material on said electrode plate;

forming a fourth insulating layer pattern over said plurality of protrusions on said electrode plate;

forming electrode side walls at side walls of the electrode plate;

removing the fourth insulating layer pattern; and forming a dielectric film and a plate electrode over the entire exposed surfaces of said electrode plate, said protrusions, and said electrode side walls.

9. A method in accordance with claim 8, wherein the step of removing the fourth insulating layer pattern includes the further step of removing the second insulating layer such that a lower surface of the electrode plate is exposed.

* * * * *